(12) United States Patent
Crook et al.

(10) Patent No.: US 7,109,728 B2
(45) Date of Patent: Sep. 19, 2006

(54) PROBE BASED INFORMATION STORAGE FOR PROBES USED FOR OPENS DETECTION IN IN-CIRCUIT TESTING

(75) Inventors: David T Crook, Loveland, CO (US); Curtis A Tesdahl, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 3 days.

(21) Appl. No.: 10/373,947

(22) Filed: Feb. 25, 2003

(65) Prior Publication Data

US 2004/0164752 A1    Aug. 26, 2004

(51) Int. Cl.
*G01R 27/26* (2006.01)
(52) U.S. Cl. ...................... 324/690; 324/115; 324/72.5
(58) Field of Classification Search ............... 324/72.5, 324/115, 121 R, 158.1, 754, 755, 759, 765, 324/690
See application file for complete search history.

(56) References Cited

U.S. PATENT DOCUMENTS

| | | | |
|---|---|---|---|
| 4,146,834 A | 3/1979 | Maltby et al. | |
| 4,672,306 A * | 6/1987 | Thong | 324/72.5 |
| 4,742,470 A | 5/1988 | Juengel | |
| 4,992,774 A | 2/1991 | McCullough | |
| 5,051,799 A | 9/1991 | Paul et al. | |
| 5,122,970 A | 6/1992 | Gilbert et al. | |
| 5,254,953 A | 10/1993 | Crook et al. | |
| 5,274,336 A | 12/1993 | Crook et al. | |
| 5,381,417 A | 1/1995 | Loopik et al. | |
| 5,498,964 A | 3/1996 | Kerschner et al. | |
| 5,557,209 A | 9/1996 | Crook et al. | |
| 5,696,451 A | 12/1997 | Keirn et al. | |
| 6,014,100 A | 1/2000 | Fehrenbach et al. | |
| 6,025,787 A * | 2/2000 | Poduje et al. | 340/870.04 |
| 6,351,112 B1 * | 2/2002 | Felps et al. | 324/72.5 |
| 6,408,008 B1 | 6/2002 | Komarek et al. | |
| 6,529,014 B1 * | 3/2003 | Nix | 324/662 |
| 6,690,922 B1 | 2/2004 | Lindemann | |
| 6,725,170 B1 * | 4/2004 | Hickman | 702/106 |
| 6,901,336 B1 | 5/2005 | Tesdahl et al. | |
| 7,034,553 B1 * | 4/2006 | Gilboe | 324/700 |

\* cited by examiner

*Primary Examiner*—Walter Benson

(57) ABSTRACT

Disclosed is a novel electrical probe that stores probe-specific information. A probe implemented in accordance with the invention includes a processor, memory, and a communications interface. Probe-specific information such as a probe identifier and/or calibration parameters that affect the true value of a measurement are stored in the probe memory. The probe-specific information may be retrieved by the processor from the probe memory via the communications interface.

15 Claims, 7 Drawing Sheets

PROBE BASED INFORMATION STORAGE FOR PROBES USED FOR OPENS DETECTION IN IN-CIRCUIT TESTING

FIELD OF THE INVENTION

The present invention relates generally to electrical measurement techniques, and more particularly to a novel measurement probe that stores probe-specific information.

BACKGROUND OF THE INVENTION

Obtaining electrical measurements from an electrical device requires at least some physical probing of the device nodes. As known in the art, all electrical probes introduce measurement error due to the intrinsic resistance, capacitance, and inductance of the probe itself. Knowledge of a probe's measurement error value is therefore essential in calculating the true measurement value of a measurement made by the probe. Factors that impact the measurement error of a probe (for example, the probe amplifier gain and probe resistance/capacitance/inductance values) may vary from probe to probe, and therefore even probes that are identical by design are subject to some slight variations relative to one another.

It would therefore be desirable to have a technique for obtaining the measurement error value specific to a given probe. It would also be desirable that such probe-specific measurement error value be static and easily accessible. In a broader sense, it would also be desirable to store probe-specific information on board the probe itself.

It is therefore an object of the invention to provide a probe and novel technique for storing and retrieving probe-specific information thereon.

SUMMARY OF THE INVENTION

The present invention is a novel electrical probe and novel technique for storing and retrieving probe-specific information to and from memory within the probe itself. An electrical probe implemented in accordance with the invention includes a processor, memory, and a communications interface within the probe itself.

In accordance with one preferred embodiment of the invention, the probe-specific information includes calibration parameters that are determined at the time of manufacture and stored in the on-probe memory. Prior to use by a measuring device in a measurement application, the calibration parameters are downloaded from the probe by the measuring device for use in calculating the true measurement values of measurements made using the probe.

In accordance with another preferred embodiment of the invention, the probe-specific information includes a probe identifier such as a serial number that is uniquely assigned to the probe at the time of manufacture and stored in the on-probe memory. Prior to use by a measuring device in a measurement application, the probe identifier is downloaded from the probe and used for association to calibration parameters specific to the probe that are stored off-probe. The calibration parameters associated with the probe through the probe identifier are then used by the measuring device for use in calculating the true measurement values of measurements made using the probe.

In accordance with an illustrative embodiment of the invention, the measurement probe is embodied in the form of a capacitive coupling probe. The probe includes a processor with memory for storing calibration parameters specific to the particular probe and a communications interface for allowing a measuring device to retrieve probe-specific information stored in memory in the probe itself.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION

A novel electrical probe which stores probe-specific information thereon is described in detail hereinafter. Although the invention is described in terms of specific illustrative embodiments, it is to be understood that the embodiments described herein are by way of example only and that the scope of the invention is not intended to be limited thereby.

Figure 1A:
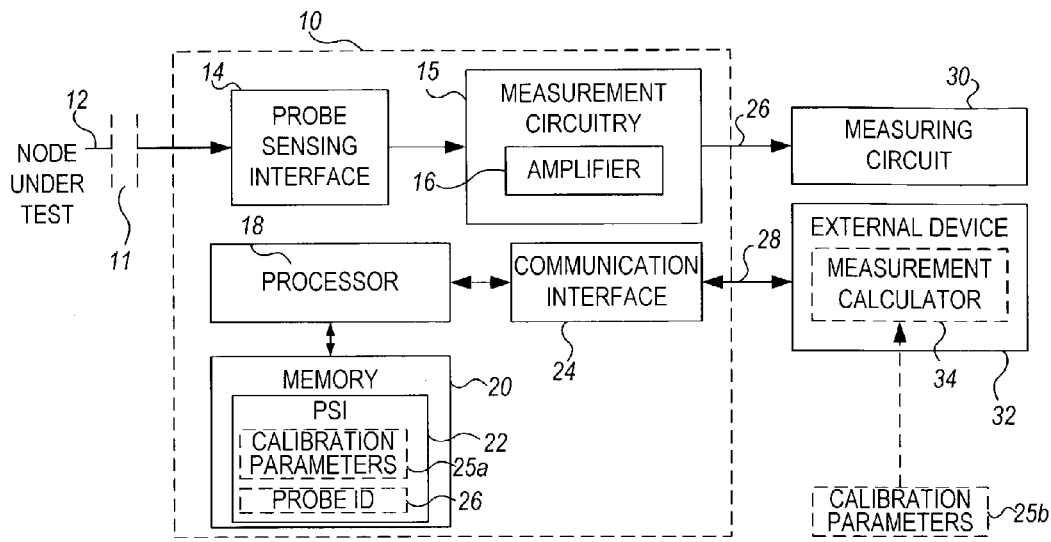
FIG. 1A is a high-level block diagram of a measurement probe implemented according to the invention.

Turning now to the invention, FIG. 1A is a high-level block diagram of a measurement probe 10 implemented according to the invention. As illustrated, the measurement probe 10 includes a probe sensing interface 14, measurement circuitry 15, a processor 18, memory 20, and a communications interface 24. The measurement circuitry 15 receives a signal present on the node under test 12, performs any measurement functionality specified by the particular probe type, and sends the measurement signal to a measuring device 30 over a measurement channel 26. For example, if the probe is a capacitive coupling probe which senses the capacitance 11 of a node under test 12, the measurement circuitry 24 may include an active buffer/amplifier circuit 16 which shields the probe sensing interface, and in particular, the conductive member carrying the sensed signal, from stray system capacitance.

In accordance with the invention, the measurement probe 10 includes memory 20 for storing probe-specific information 22 and a microprocessor 18 for reading and writing the probe-specific information 22. Communications interface 24 allows communication between the probe 10 and an external device 32 (such as an in-circuit tester) over a communications channel 28 for at least the purpose of allowing the measuring device to at least retrieve the probe-specific information 22 from the memory 20.

In the illustrative embodiment of FIG. 1A, an analog or digital signal on a node under test 12 of an electrical device such as a printed circuit board is capacitively sensed by the probe 10 via the probe sensing interface 14. A buffer/amplifier circuit 16 (hereinafter "amplifier" 16) implemented within the measurement circuitry 15 is adapted to receive and amplify the capacitively sensed signal.

Prior to use for testing, the probe 10 is calibrated. For purposes of clarity, the term "calibrate" refers herein to the process of determining the characteristic variables (or "parameters") of the probe itself that affect the true value of a measured signal. The term "calibration parameter" refers to the characteristic variables specific to the probe itself.

To perform the calibration, the probe 10 is used to make measurements on known good components having known component values. Calibration parameters of the probe (such as the characteristic capacitance, inductance, and resistance, the error gain and offset, and/or the error amplitude and phase at one or more given frequencies) are determined based on the measurements and known component values. The characteristic capacitance, inductance, and resistance of the probe includes the input capacitance, inductance, and resistance of the probe circuitry, the probe sensing interface, and any distributed or parasitic capacitance, inductance, and resistance introduced between the probe sensing interface and circuitry. The characteristic capacitance, inductance, and resistance may be stored separately, or alternatively may be combined into a single calibration parameter in the form of a response gain or a response error of the probe. Other calibration parameters that affect the true value of the sensed signal may also be stored. Calibration parameters 25a may be stored as the probe-specific information 22 in the memory 20 of the probe 10. Alternatively, other parameters specific to the probe, such as a probe serial number, are stored in the memory 20 and used to look up calibration parameters 25b associated with the probe that are stored off-probe. Calibration parameters 25a, 25b are used in measurement calculations by a measurement calculator 34.

Figure 1C:
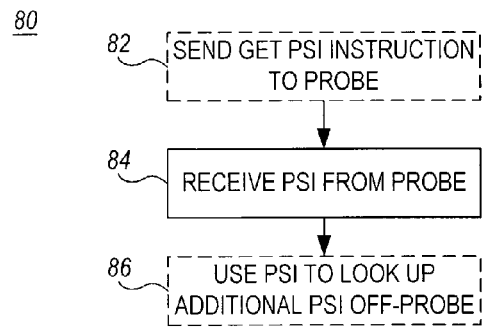
FIG. 1C is an operational flowchart illustrating an exemplary embodiment of a method for communicating with a probe of the invention.
Figure 1B:
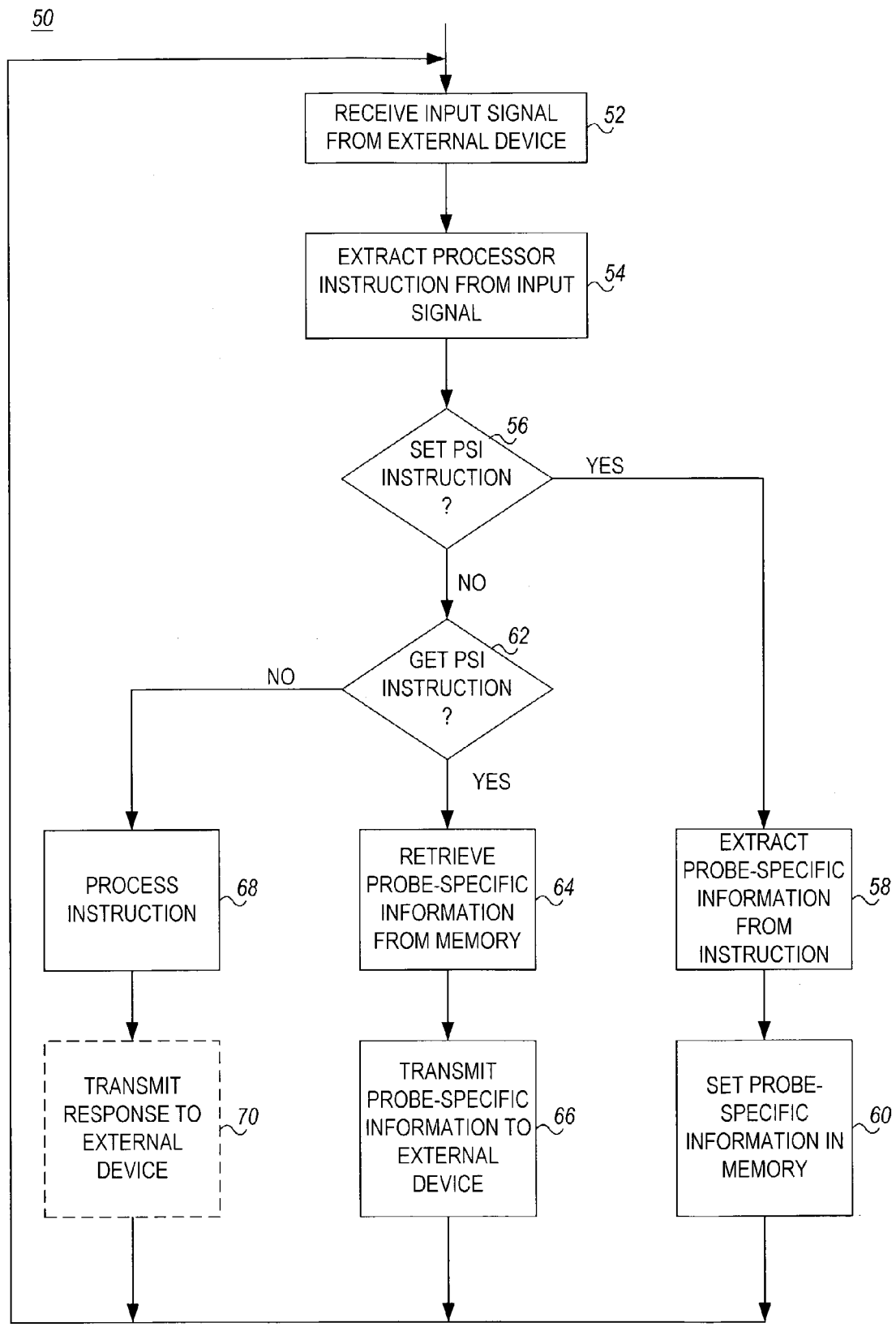
FIG. 1B is an operational flowchart illustrating an exemplary embodiment of a method performed by the probe processor.

FIG. 1B illustrates the operation of the probe 10 with respect to setting and retrieving probe-specific information 22. As shown, the probe 10 receives 52 and input signal from the measuring device over communication channel 28. The communications interface 24 performs any necessary processing (e.g., amplification, A/D conversion, sample-and-hold operations, serial-to-parallel signal conversion, error correction, digital packet formation, etc.) to extract 54 an instruction from the input signal. The processor 18 decodes the instruction. If the instruction is a SET PSI instruction, as determined in step 56, the data associated with the instruction is extracted 58 from the instruction, and the processor 18 stores 60 the data in memory 20 as the value of the specified probe-specific information 22. If the processor instruction is instead a GET PSI instruction, as determined in step 62, the processor 18 retrieves 64 the specified probe-specific information 22 from memory 20 and sends it to the communications interface 24 for transmission 66 to the measuring device over communication channel 28. Instructions other than the SET PSI and GET PSI instructions are processed 68 by the processor and any instruction responses sent to the communications interface 24 for transmission 70 to the measuring device over the communication channel 28.

FIG. 1C illustrates the operation of an external device for obtaining the probe-specific information 22 from the probe 10. As shown, at a minimum, the external device receives 84 the probe-specific information 22 from the probe. This may occur as an automatic operation (for example, at power up of the probe), or it may require that the external device send a request such as a GET PSI instruction to the probe, as illustrated in optional step 82. The received probe-specific information 22 obtained in step 84 may complete the operation (such as when the probe-specific information 22 comprises the calibration parameters 25a), or alternatively, the probe-specific information 22 is then used off-probe to look up additional probe-specific information stored off-probe (for example, when the probe-specific information 22 includes probe identification information 26 that is used to look up the probe's calibration parameters 25b that are stored off-probe).

Figure 2:
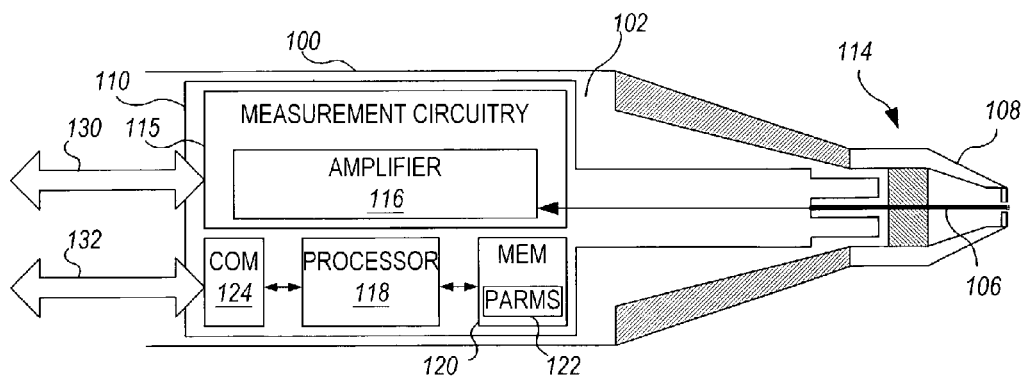
FIG. 2 is a block diagram of a probe implemented in accordance with the invention.

FIG. 2 illustrates a generic probe 100 implemented according to the invention. As illustrated, the probe 100 includes a probe circuit board 110 situated within the body 102 of the probe 100 on which the measurement circuitry 115 (including amplifier 116), processor 118, memory 120 (comprising probe-specific information 122), and communications interface 124 are implemented. The probe sensing interface 104 includes an inner conductor 106 which connects to the input of the amplifier 116 and is shielded by shield 108. The capacitance of probe sensing interface 114 is the capacitance between inner conductor 106 and shield 108. Distributed capacitances (e.g., from interconnecting wires, cables, traces or pins) may be reduced by mounting amplifier the 116 as close to probe sensing interface 104 as possible. To accomplish this, amplifier 116 is mounted in body of the probe 100 as shown in FIG. 2. Measurement circuitry 115, processor 118, memory 120, and communications interface 124 may be manufactured as an IC, a hybrid microcircuit, or a miniaturized PCB to facilitate mounting inside the body 102 of the probe 100.

In operation, the probe 100 may be used to sense a signal on a node of interest (not shown). In the preferred embodiment, prior to use for end-application sensing, the probe 100 is calibrated. Calibration may be performed at time of manufacture by the manufacturer, or later by the test technician prior to use of the probe in making a measurement on an electrical device under test. One method of calibration involves use of the probe 100 in making measurements on one or more nodes of an electrical device having known true measurement values. The calibration parameters 122 may be calculated based on the actual measurement values versus the true measurement values. Once the calibration parameters 122 are determined, they are associated with the probe. Association with the probe 100 may be accomplished according to one technique by storing the calibration parameters 122 directly within the memory 120 of the probe 100, such that they may be downloaded when needed via the communications interface 124. Another technique for associating calibration parameters 122 with a probe is by storing a probe identifier within the memory 120 of the probe which can be used to look up the probe's associated calibration parameters that are stored off-probe.

In the preferred embodiment, prior to making a measurement in end-application sensing, the calibration parameters 122 are retrieved. If the calibration parameters 122 are stored in the memory 20 of the probe 100, they are retrieved by sending an appropriate instruction(s) to the processor 118 via the communications interface 124 over the communications channel 132. Upon receiving the instruction(s), the processor 118 accesses the calibration parameters 122 from memory 120, and returns them over the communications channel 132 with the assistance of the communications interface 124.

If, in the alternative, the calibration parameters 122 are stored off-probe, the probe identifier is retrieved from the memory 20 of the probe via the communications interface 124 and used o look up the probe's associated calibration parameters that are stored off-probe.

When used to make a measurement, the inner conductor 106 of the probe 100 is placed in electrical contact with the node of interest and the measurement circuitry 115 returns a measurement signal to a measuring circuit (not shown) over a signal channel 130.

Turning now to consider the user of measurement probes in mass production printed circuit board (PCB) assembly and testing, it is known that a PCB is subject to many different types of defects during the assembly process. Accordingly, various test and inspection techniques exist to locate these defects. Today there are three general test methods used to find PCB defects: electrical test, optical (or visual) inspection, and x-ray inspection. Of these, electrical test, and in particular a technique known as "in-circuit test", is the most mature and most commonly used technique.

One prevalent defect in PCB assemblies is an open connection due to poor solder bonds, incomplete traces, and/or missing devices that are either never loaded onto the board or which fall off during the assembly process. One method for detecting open connections on a PCB under test at the electrical test stage of the process is known as in-circuit test, and in particular, capacitive measurement in-circuit test.

In-circuit test utilizes an in-circuit tester. The in-circuit tester includes a bed-of-nails test-head having a number of tester interface pins. A fixture having a number of probes is mounted over the bed-of-nails of the tester such that the fixture probes align with and contact tester interface pins. A printed circuit board under test is mounted in the fixture such that the fixture probes electrically contact various nodes of interest on the PCB under test. Analog in-circuit tests detect missing components on the PCB under test by probing the appropriate nodes to which the component under test should be attached, and measuring the value, in appropriate units (e.g., resistance, capacitance, etc.), of the component under test. If the measured value is within predetermined limits of the expected value, the test infers that the component under test is indeed present.

Figure 3:
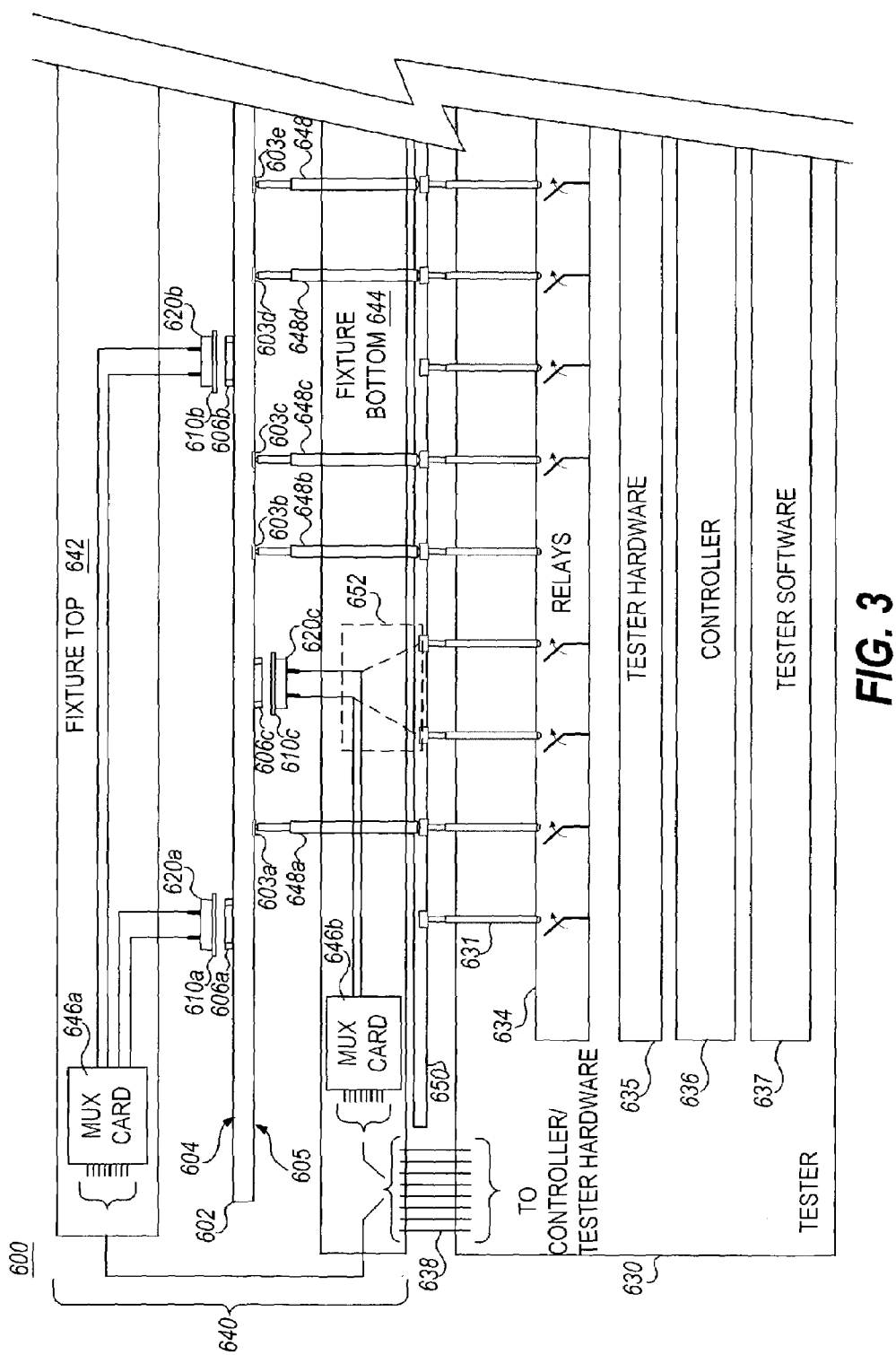
FIG. 3 is a block diagram of an in-circuit tester employing a capacitive coupled test probe implemented in accordance with the invention.

Turning now to FIG. 3, there is shown a portion of an in-circuit test system 600 employing, for illustrative non-limiting purposes only, several capacitive coupling probes 620a, 620b, 620c implemented in accordance with the invention. As illustrated, the in-circuit test system 600 includes a tester 630 and a fixture 640 for seating a PCB under test 602. Due to the close spacing of the tester interface pins, nodes of the PCB under test, and small size of the components under test, only a small edge portion of the tester/fixture/PCB under test combination is shown for ease of illustration.

Tester 630 includes a plurality of tester interface pins 631 arranged in an array (or "bed-of-nails") along the top side of the tester 630. Tester 630 includes tester hardware 635 which operates under the control of a controller 636. Controller 636 may be controlled by tester software 637, which may execute within the tester 630 itself, or remotely via a standard communication interface. One function of the controller 636 is to configure the hardware 635 to make or to not make electrical connections between measurement circuits 638 within the tester and each of the test interface pins 631. To this end, each test interface pin 631 is connectable to or isolated from the tester hardware by a relay 634. Electrical contact between the test resources and a respective test interface pin 631 may be made by closing its corresponding relay 634; conversely, the pin 631 may be isolated from the test hardware by opening its corresponding relay 634.

Mounted on top of the tester 630 and over the bed-of-nails test interface pins 631 is the test fixture 640. The test fixture 640 may directly interface the test interface pins 631 to fixture probes 648, or as shown, may indirectly interface the test interface pins 631 to fixture probes 648 through a test adapter 650 (shown in the form of a double-sided PCB and known as a "wireless test adapter"). The fixture 640 is mounted over the tester interface pins 631 of the tester 630 such that the bottom tips of its double-ended spring probes 648 make electrical contact with the top tips of corresponding test interface pins 631 of the tester 630, either directly, or through a test adapter 650 as shown. The top tips of the double-ended spring probes 648 align with and make electrical contact with conductive pads of interest 603a, 603b, 603c, 603d, 603e on the bottom side of the PCB under test 602.

The fixture 640 includes a fixture top 642 and a fixture bottom 644. The fixture bottom 644 includes a plurality of double-ended spring probes 648 that are inserted through precisely aligned holes in the fixture bottom 644. For convenience of illustration and clarity of the invention, only five such double-ended spring probes 648 are shown; however, it will be appreciated by those skilled in the art that a conventional in-circuit tester will typically have thousands of such probes.

The fixture 640 is configured with a number of capacitive coupling probes 620a, 620b, 620c. For convenience of illustration and clarity of the invention, only three such capacitive coupling probes 620a, 620b, 620c are shown; however, it will be appreciated by those skilled in the art that a conventional in-circuit tester may have hundreds of such probes. Depending on the configuration of the PCB under test 502, probes may be mounted in one or both of the fixture top 642 and fixture bottom 644. In the illustrative embodiment, the probes 620a, 620b are mounted to the fixture top 642 such that the capacitive plate 610a, 610b of each apparatus 620a, 620b precisely aligns over its corresponding component under test 606a, 606b when the PCB 602 is properly mounted in the fixture 640.

In the illustrative embodiment, the PCB 602 includes component under tests 606a, 606b, 606c mounted on both sides of the board. Accordingly, accommodation for capacitive coupling probes 620 must be made for both sides of the board 602. In this regard, the fixture bottom 644 may also be configured with a number of capacitive coupling probes 620c, one each corresponding to each component under test 606c on the bottom side 605 of the PCB 602 under test. The capacitive coupling probes 620c are mounted to the fixture bottom 644 such that the capacitive plate 610c of each apparatus 620c precisely aligns beneath its corresponding component under test 606c when the PCB 602 is properly mounted in the fixture 640.

In the preferred embodiment, the fixture 640 may include one capacitive coupling probe 620 for each integrated circuit, capacitor, resistor, or other component of interest on the printed circuit board 602. Accordingly, a large number of capacitive coupling probes 620 may be required. For this reason, it may be desirable to multiplex the control signals 642 from the tester 630 going to each capacitive coupling probe 620 to reduce the number of control lines between the tester 630 and fixture 640. In the illustrative embodiment, a single 8-bit multiplexer card 646a, 646b may be used to address up to 256 different capacitive coupling probes 620. The multiplexer cards 646a, 646b may also be configured to include a digital driver and receiver (shown hereinafter as interface circuit 500 in FIG. 8) for each addressable capacitive coupling probe 620.

Of course, it will be appreciated that the drivers and receivers of each capacitive coupling probes 620 may alternatively be wired in a one-to-one correspondence with the tester 630 without the use of multiplexers 646a, 646b, 646c, or other control line reduction schemes. In yet another alternative embodiment, shown at 652, the capacitive coupling probes may be connected to nodes on the fixture, which may be probed by tester interface pins 631. In this alternative configuration 652, the capacitive coupling probes may be driven by the tester resources 635 through the tester interface pins 631.

Capacitive coupling probes are used to perform in-circuit capacitive measurement tests. Capacitive measurement test, such as Agilent Technology's TestJet™ probe and technique (described in detail in U.S. Pat. No. 5,254,953 to Crook et al., U.S. Pat. No.5,274,336 to Crook et al., U.S. Pat. No. 5,498,964 to Kerschner et al., U.S. Pat. No. 5,557,209 to Crook et al., and U.S. Pat. No. 5,696,451 to Keirn et al., each of which is incorporated herein by reference for all that it teaches), detects when a device pin is not properly connected to its trace on the PCB. The technique uses a probe (shown in FIG. 3 at 620a, 620b, 620c) having an-external plate (shown in FIG. 3 at 610a, 610b, 610c) suspended over the device under test and separated from the lead frame by the plastic or ceramic material of the device housing. The lead frame and external plate form a small capacitor that can be measured by stimulation with an AC source. When the device pin is not electrically connected to the trace, an additional capacitance results in series with the TestJet™ capacitor. This additional capacitance exists due to the tiny air gap between the pin and trace. This is a very small capacitance, much smaller than the TestJet™ capacitor, so the series combination of the TestJet™ and this additional pin capacitor is smaller than either capacitor. A threshold value can be set for each pin of each device under test to discriminate between present and absent devices.

Figure 4A:
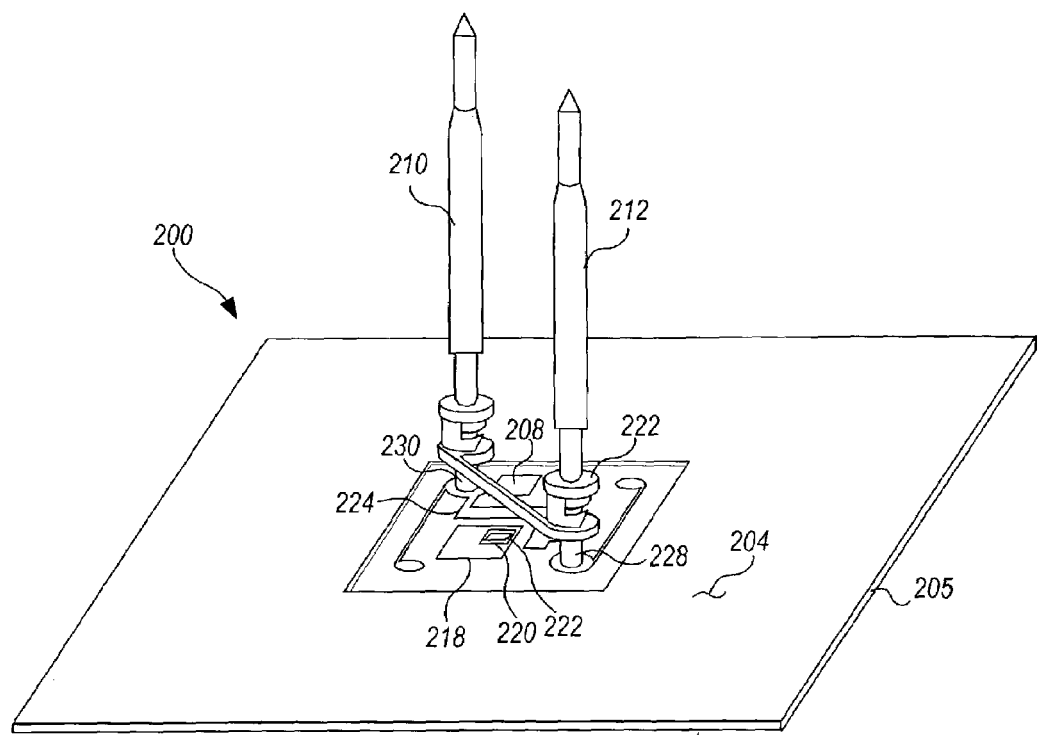
FIG. 4A shows a top, front perspective view of a preferred embodiment of a capacitive coupling probe implemented according to the invention.
Figure 4B:
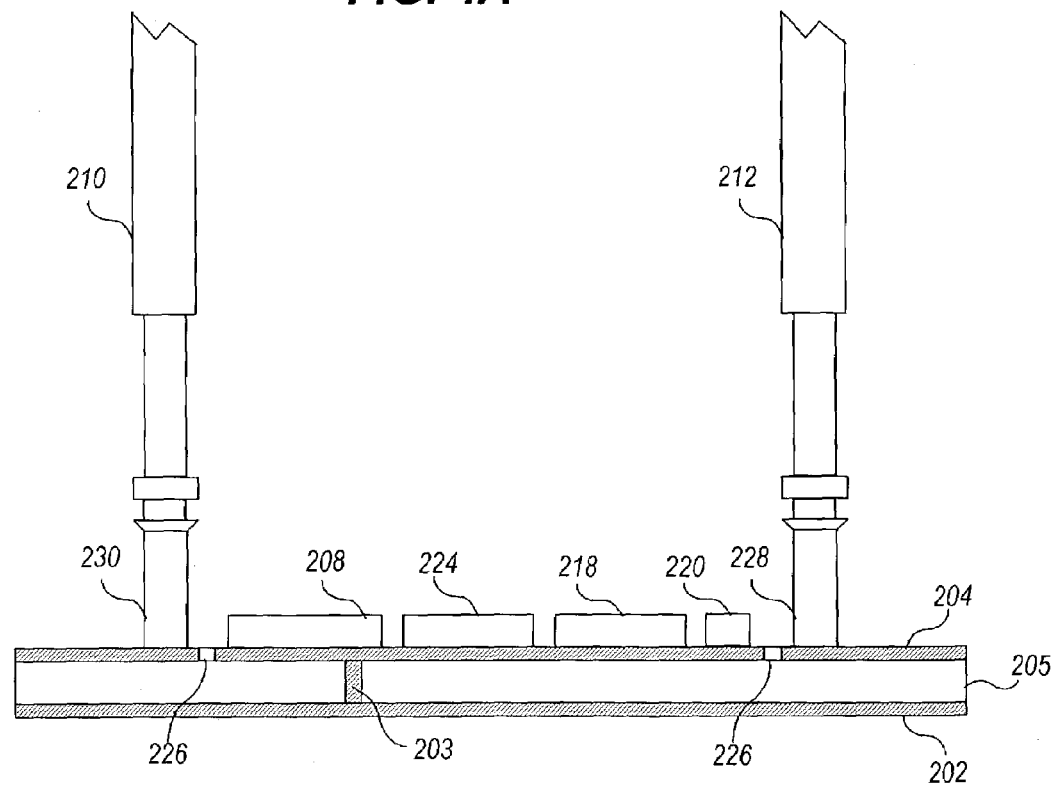
FIG. 4B shows a side cut-away view of the capacitive coupling probe of FIG. 4A.

FIG. 4A shows a top, front perspective view and FIG. 4B shows a side cut-away view of a preferred embodiment of a capacitive coupling probe 200 implemented according to the invention. As illustrated, the capacitive coupling probe 200 includes a capacitive plate 202, a guard plate 204, an amplifier circuit 208, a guard electrode spring pin 210 and a signal electrode spring pin 212. The capacitive plate 202 and the guard plate 204 in the probe 200 are preferably made of copper, but can be made of any electrically conductive material. The capacitive plate 202 and the guard plate 204 are separated by a dielectric 205, such as glass filled plastic or any other insulative material. The dielectric is approximately 0.04 inches thick. It should be understood that if the dielectric 205 is too thin, the capacitive reading will be distorted upward, and if the dielectric is too thick, the shielding effect of the guard plate 204 will be reduced and stray system capacitance will be detected. The capacitive plate 202 of the test probe 200 is electrically coupled to an amplifier circuit 208, which is located on the top surface of the dielectric 205 and surrounded by the guard plate 204. The capacitive plate 202 is connected to the amplifier circuit 208 at a location 203. The amplification of the signal by the amplifier circuit 208 which is in close proximity to the capacitive plate 202 where the signal is received helps to significantly optimize the signal to noise ratio, thereby decreasing the effect of system noise and stray capacitance. However, this can be accomplished by other means such as shielding by means of a coaxial cable or a conductive foam surrounding the spring pins 210 and 212. Further, after learning what the unwanted signal and noise is, through calibration at manufacturing time or prior to use in testing, this value can be stored as probe-specific information 222 in the memory 220. At test time, the probe-specific information 222 may then be downloaded from the probe 200 via communications interface 224 and those downloaded values can be used as measurement correction factors by the external measuring circuit in the tester.

During manufacturing, the dielectric 205 is deposited on the capacitive plate 202, and then the guard plate 204 is deposited on the dielectric 205. Next, the guard plate is etched down to the dielectric 205 to form traces for the amplifier circuit 208, processor 218, memory 220, and communications interface 224. A groove 226 is etched all the way around the probe circuitry area to electrically isolate the probe circuitry from the guard plate. During manufacturing, the amplifier circuit 208, processor 218, memory 220, and communications interface 224 are mounted to the traces formed from the guard plate by using a chip on board procedure. The amplifier circuit 208 is electrically connected by a pin in socket connector 228 to a standard signal electrode spring pin 212, which acts as an electrical coupling means to a measuring device. The guard plate 204 is electrically connected via connector 230 to a guard electrode spring pin 210, which electrically couples the guard plate to system ground or a controlled voltage source.

Spring pins 210 and 212 can be standard off-the-shelf spring pins, such as a 100PR4070 made by QA Technology Company of Hampton, N.H. Spring pins 210 and 212 give the test probe z axis travel, which allows for intimate coupling with the integrated circuit component to be tested, regardless of the height of the component. Also, when the invention is used to test an entire circuit board, such as PCB 602 in FIG. 3, the z axis travel of the spring pins permit all of the capacitive coupling probes 620a, 620b, 620c to intimately contact the corresponding components 606a, 606b, 606c, even if the heights of the components are not uniform. This z axis travel can be accomplished by other means such as hydraulic pins with z axis travel. Moreover, the z axis travel is not necessary, as long as the test probe is a predetermined distance from the component under test.

Figure 5A:
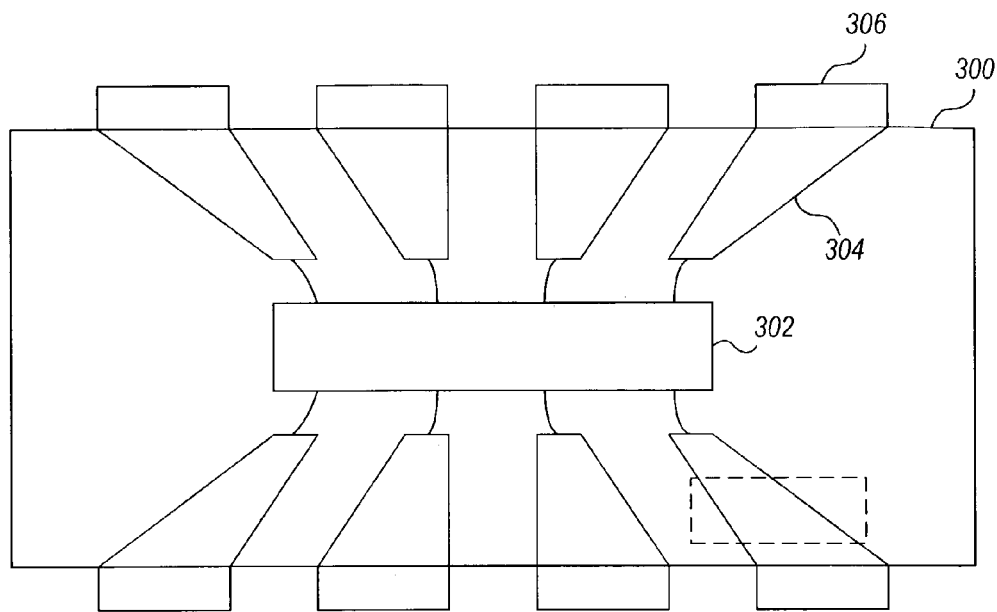
FIG. 5A is a top cut away view of an integrated circuit component.
Figure 5B:
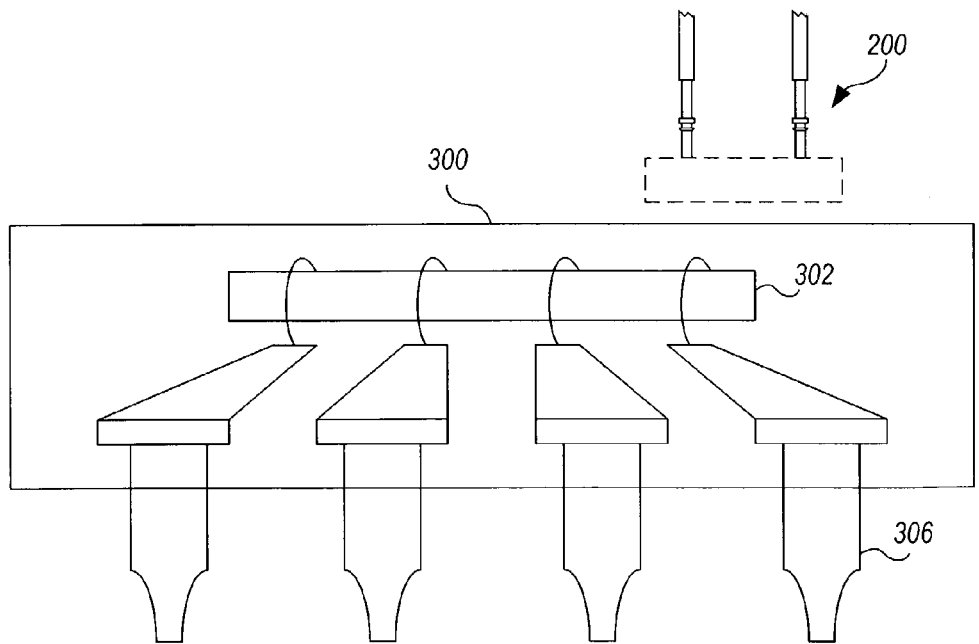
FIG. 5B is a side cut away view of the integrated circuit component of FIG. 5A and a capacitive coupling probe of the invention.

FIG. 5A shows a top cut away view and FIG. 5B shows a side cut away view of an integrated circuit component 300 and the capacitive coupling probe 200 of FIGS. 4A and 4B. FIGS. 5A and 5B illustrate how the capacitive coupling occurs between the capacitive coupling probe 200 and the leads 306 of the integrated circuit 300. As shown, the integrated circuit package 300 contains an integrated circuit die 302. The integrated circuit die 302 contains connections; however, these connections must be made to the outside of the integrated circuit package 300. Therefore, the lead 306 is connected to an internal conductor 304 which connects the lead 306 to a location just adjacent to the integrated circuit 302. There, a small wire (bond wire) 308 spans between the conductor 304 and a connection location on the integrated circuit 302. Similar connections are made to all the other leads of the integrated circuit package 300.

As shown in FIG. 5B, the conductor 304 forms an electrically conductive plate, which acts as one plate of a capacitor. The other plate of the capacitor is formed by a capacitive plate of the capacitive coupling probe 200. Although the capacitor created in this manner is small, it is sufficient to conduct a signal between the lead 306 and the capacitive coupling probe 200, here illustrated by dashed lines, indicating that the test probe 200 is placed over the top of the integrated circuit package 300.

Figure 6:
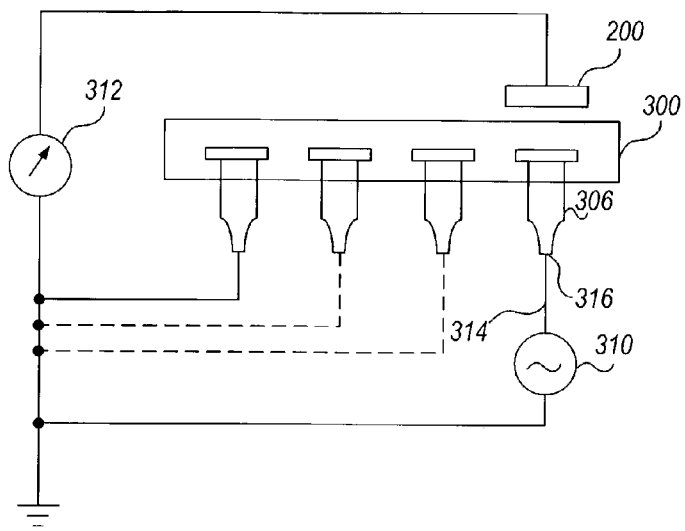
FIG. 6 shows a schematic overall view of the operative implementation of the capacitive coupling probe of FIGS. 5A and 5B.

FIG. 6 shows a schematic overall view of the operative implementation of the capacitive coupling probe 200. As illustrated, the system of one implementation of use of the capacitive coupling probe 200 uses a signal source 310, which supplies a signal, typically eight kiloHertz (8 KHz) at two hundred millivolts (200 mV). The output of signal source 310 is connected to a printed circuit board trace 314, which is connected to the integrated circuit lead under test 306 at 316. In the preferred embodiment, the connection of the signal source 310 to the trace 314 is typically made through a bed of nails connection pin.

The capacitive coupling probe 200 is placed on top of the integrated circuit package 300. The capacitive coupling probe 200 is connected to a measuring device 312, such as an ammeter, a voltmeter or computing means to compute the effective capacitance. When the measurement falls outside predetermined limits a determination is made that the lead being tested has an open connection.

When the test is performed, the signal source 310 is activated and applied to trace 314 on the printed circuit board which should be attached to the lead being tested 306 at location 316. The signal should then pass to the lead 306 of the component 300. Through capacitive coupling, the signal is passed to the capacitive coupling probe 200 and then to the measuring device 312. If the measured parameter falls within predetermined limits, then the lead 306 is connected to the trace 314 at location 316. If the lead 306 is not connected at location 316 or if the wire trace 314 is broken, a smaller signal will be conducted to the capacitive coupling probe 200 and the measurement will not meet the threshold level of the measuring device 312, indicating that an open fault is present.

Because the signals being measured are extremely small, the effects of noise, system capacitance and cross-talk must be minimized as much as possible. One technique to reduce undesired capacitance when testing an integrated circuit is to guard all ground, power and other device leads not directly involved in the measurement of the integrated circuit. The grounding of unused leads is called "guarding" which is presently considered the best mode to reduce noise. This guarding prevents cross-talk between the lead being tested and other leads on the integrated circuit component, thus, reducing any stray capacitive coupling between leads and providing a better indication of when a lead is not connected. This technique is particularly effective since this usually grounds the printed circuit board ground plane which is also connected to many leads of other integrated circuits, thus reducing levels of undesired capacitance.

As an example experimental data has shown that the capacitance between the component lead 306 and the test probe 200 is approximately 40 femto farads of capacitance for a 0.65 mm pitch quad flat pack. If the capacitance change for a pin is less than 30 femto farads, than the solder joint is open. This value could be increased or decreased by the user to improve the diagnostic accuracy of the test.

Figure 7:
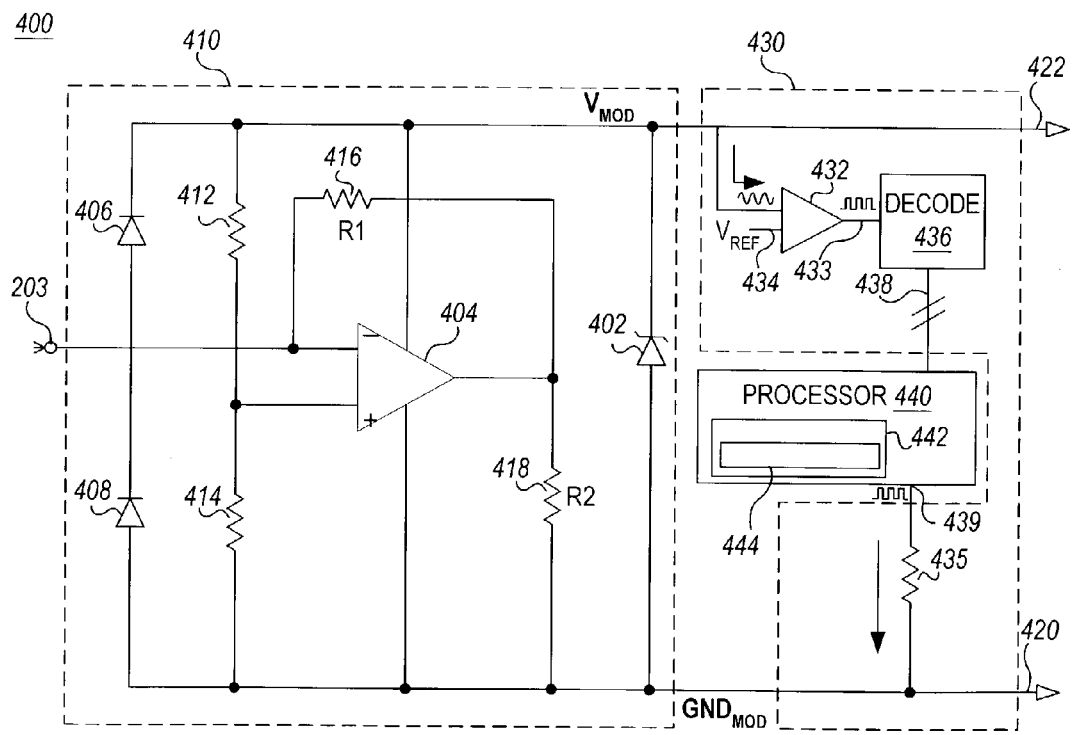
FIG. 7 is a schematic of a preferred embodiment of a probe printed circuit board implemented in accordance with the invention.

FIG. 7 is a schematic of a preferred embodiment of a probe printed circuit board 400 implemented in accordance with the invention. The printed circuit board 400 includes an active amplifier circuit 410, a communications interface 430, a processor 440, and memory 442 which stores probe-specific information 444. Referring now to the active amplifier circuit 410, circuit 410 is a standard amplifier circuit used to amplify the signal received from the capacitive plate 202 at 203 (FIG. 4B), thus increasing the signal to noise ratio and decreasing the effects of stray capacitance. There can be many alternative circuits to accomplish this amplifying effect as would be readily apparent by an artisan in the field. The amplifier 404 is a standard operational amplifier, such as a TL072 by Texas Instruments of Dallas, Tex. Diodes 406 and 408 are standard silicon small signal diodes and diode 402 is a 7.5 V zener diode. Resistors 412 and 414 are 100 K ohm resistors and resistors 416 and 418 are 1 M ohm and 464 ohm resistors, respectively. The circuit output 422 is electrically coupled to the signal spring pin 212 and the circuit ground 420 is electrically coupled to system ground by guard spring pin 210. Active amplifier circuit 410 is utilized in the present invention to reduce the effects of stray capacitance by amplifying the signal, thus making stray capacitance relatively insignificant. This circuit is used as it is cost effective and easy to implement. However, other shielding means in place of the active amplifier circuit could be used, such as a coaxial cable around the spring pin 212 and attached to or in place of the guard plane 204 of the test probe 200.

As previously mentioned, the printed circuit board 400 also includes a communications interface 430, a processor 440, and memory 442. It is to be understood that the processor 440 may be implemented by any one or more of the following: microprocessor, microcontroller, ASIC, FPGA, digital state machine, and/or other digital circuitry. It is also to be understood that the communications interface 430 may be implemented according to any one of many different well-known communication techniques, including (by way of limitation only and not limitation) serial or parallel, wired or wireless, over a dedicated or multiplexed channel, etc. In the preferred embodiment, the processor 440 is a custom FPGA and the communication interface 430 is a wired serial interface that generally includes amplification circuitry, sample-and-hold circuitry, frame detection circuitry, and a serial-to-parallel converter. Communication interface 430 may also include error detection/correction circuitry and instruction packet extraction circuitry depending on the communications protocol.

In the particular embodiment shown, digital signals sent to the processor 440 from a measuring device (such as the tester 530 in FIG. 3) are modulated with the probe input signal carried over the signal spring pin 212 and therefore must be demodulated and decoded into a form required by the processor 440. In the preferred embodiment, the amplitude of the input signal is 6 V, and the digital signal is modulated over the input signal. In the modulated signal $V_{IN\_MOD}$, a high level of the modulated digital signal DATA 552 (FIG. 8) is represented in the modulated signal $V_{MOD}$ by a voltage level of approximately 6 V and a low level of the modulated digital signal DATA 552 is represented in the modulated signal $V_{MOD}$ by a voltage level of approximately 4.5 V. The low level is at least above the high signal level threshold of the amplifier circuitry. Accordingly, the digital signal is carried on the input signal and oscillates above the high signal level threshold (typically 3–4 V) of the amplifier circuitry between 4.5 V and 6 V. Thus, the amplifier circuitry is not adversely affected by the signal variation on signal spring pin 212 due to the modulation.

In order to recover the transmitted signal from the modulated signal $V_{IN\_MOD}$, in the preferred embodiment, the communications interface 430 therefore includes a comparator 432 which receives on one input the modulated input signal $V_{MOD}$ present on the signal spring pin 212, and on the other input a reference voltage $V_{REF}$. The reference voltage is preferably set at 5 V. The comparator 432 compares the voltage level of the modulated signal $V_{MOD}$ with the reference voltage $V_{REF}$, and outputs on line 433 a high voltage level if the modulated signal $V_{MOD}$ is above the reference voltage $V_{REF}$, and outputs a low voltage level if the modulated signal $V_{MOD}$ is below the reference voltage $V_{REF}$. Accordingly, the output of the comparator 432 is a pulse stream. A decoder 436 is electrically coupled to the output line 433 of the comparator 432 at its input. The decoder 436 converts the serialized bit stream from the pulse stream into parallel instructions, which are output on lines 438. Although not shown, the decoder 36 may include amplification circuitry, sample-and-hold circuits for recovering each bit from the pulse stream, synchronization (frame detection) circuitry for detecting the beginning and end of each packet, error correction circuitry for verifying proper transmission of the signals, a serial-to-parallel converter, and other standard functionality required for recovering a parallel digital signal from an analog input signal according to the particular transmission implementation.

The processor 440 receives the parallel instruction bits on lines 438, and performs the operation indicated by the instruction.

Some instructions, for example a memory read instruction, will require the processor 440 to return information over the guard spring pin 210 which is electrically coupled to a circuit ground 420. Accordingly, in the illustrative embodiment, the digital output signal is converted from a parallel signal to a serial bit stream internal to the processor 440, and output onto the processor's serial output pin 439. Resistor 435 is coupled between serial output pin 439 and the circuit ground 420, which is in turn electrically coupled to the guard spring pin 210. The serial bit stream output on pin 439 is therefore modulated with the circuit ground signal as resistor 435 operates to attenuate the pulse stream, such that the circuit ground signal $GND_{MOD}$ on line 420 varies in voltage level between approximately 0 V and 2 V, where the low signal level of the pulse stream is represented by approximately 0 V and the high signal level of the pulse stream is represented by approximately 2 V, or at least less than the low signal level threshold of the amplifier circuitry. Accordingly, the amplifier circuitry 410 is not adversely affected by signal modulation on its ground.

Figure 8:
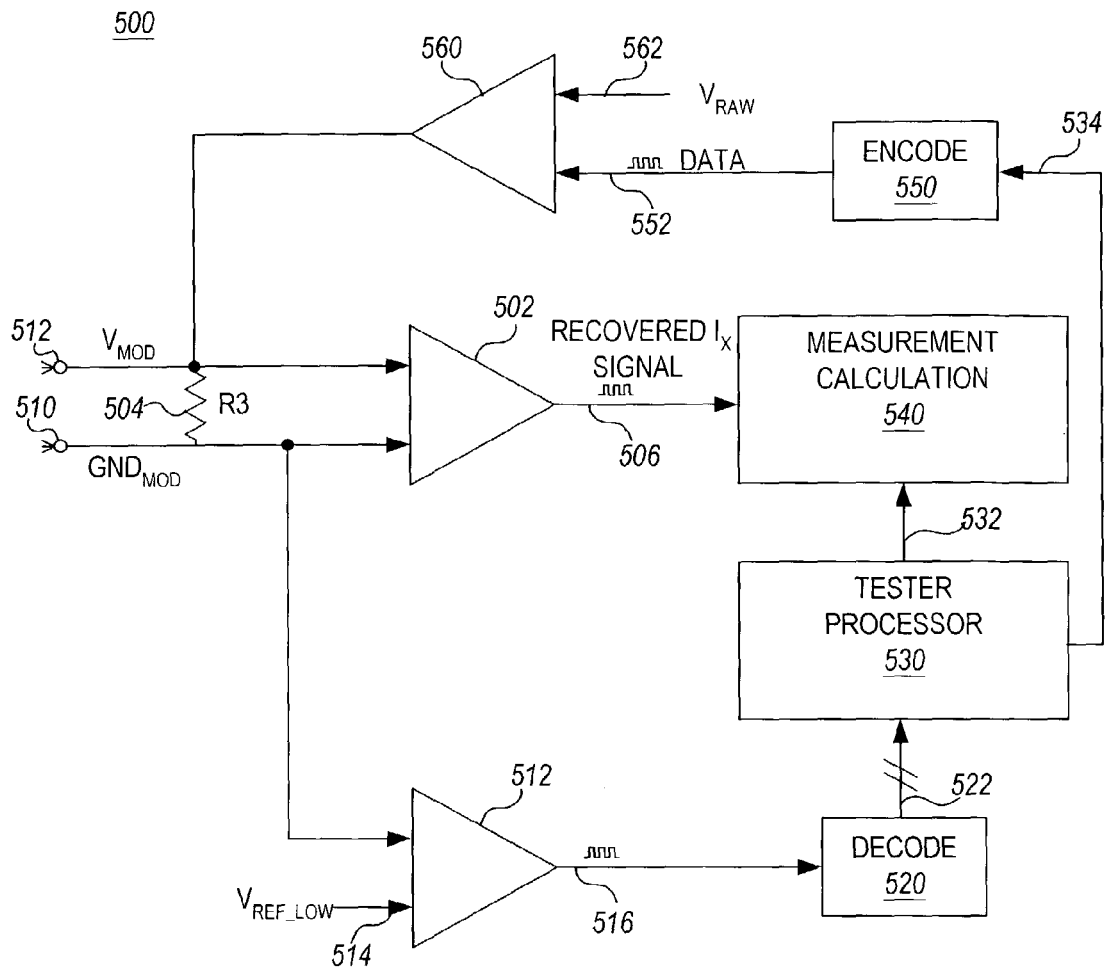
FIG. 8 is a schematic diagram of an interface circuit 500 which is couplable to the probe 200 of the invention.

FIG. 8 is a schematic diagram of an interface circuit 500 which is couplable to the probe 200 of the invention. The interface circuit output 512 is electrically coupled to the signal spring pin 212 and the circuit ground 520 is electrically coupled to system ground by guard spring pin 210. Referring now to FIG. 8, in the particular embodiment shown, comparator 502 receives the modulated ground signal $GND_{MOD}$ on guard spring pin 210 and the modulated input signal $V_{MOD}$ on signal spring pin 212 pins of the probe 200. The current $I_x$ representative of the capacitance between the probe capacitive plate 202 and the integrated circuit pin under test may be calculated from the output voltage of the comparator 502 based on the equation: $V=I_x*(R1/R2)*R3$. The measurement calculation block 540 receives the output of the comparator 502 and calculates the capacitance between the capacitive probe plate and pin under test.

Prior to taking a measurement, the measurement calculation block 540 communicates with the probe 200 to obtain the calibration parameters 442 which are required by the tester to calculate measurements obtained from the probe. To this end, the test processor 530 generates instructions 534 which are encoded by the encode block 550 to generate a serial bit stream DATA 552. Digital modulator 560 modulates the serial bit stream DATA 552 with the raw input signal $V_{IN\_RAW}$ 562 to generate a modulated input signal $V_{MOD}$ on line 512, which is in turn electrically coupled to the signal spring pin 212. In the preferred embodiment, the raw input signal $V_{IN\_RAW}$ has an amplitude of 6 V. A high level of the modulated digital signal in the modulated input signal $V_{MOD}$ is represented by a voltage level of approximately 6 V and a low level of the modulated digital signal in the modulated input signal $V_{MOD}$ is represented by a voltage level of approximately 4.5 V, which is at least above the high signal level threshold of the amplifier circuitry. Accordingly, the digital data DATA 552 is carried on the input signal and oscillates above the high signal level threshold (typically 3–4 V) of the amplifier circuitry between 4.5 V and 6 V. Thus, the amplifier circuitry 410 (FIG. 7) is not adversely affected by the signal variation on signal spring pin 212 due to the modulation.

In order to receive instruction responses such as requested calibration parameters 442 from the probe 200, the modulated ground signal must be demodulated and decoded. To this end, interface circuit 500 includes a comparator 512 which receives on one input the modulated ground signal $GND_{MOD}$ and on the other input a low level signal threshold $V_{REF\_LOW}$ 514. The reference voltage is preferably set at 1.5 V. The comparator 512 compares the voltage level of the modulated ground signal $GND_{MOD}$ with the low level signal threshold $V_{REF\_LOW}$ 514, and outputs on line 516 a high voltage level if the modulated signal is above the reference voltage $V_{REF\_LOW}$ 514, and outputs a low voltage level if the modulated signal is below the reference voltage $V_{REF\_LOW}$ 514 Accordingly, the output of the comparator 516 is a pulse stream. A decoder 520 is electrically coupled to the output line 516 of the comparator 512 at its input. The decoder 520 converts the pulse stream into parallel instruction responses, which are output on lines 522. Although not shown, the decoder 520 may include synchronization circuitry, sample-and-hold circuits for recovering each bit from the pulse stream, error correction circuitry for verifying proper transmission of the signals, and other standard functionality required for recovering a parallel digital signal from an analog input signal according to the particular transmission implementation. The processor 550 receives the parallel instruction responses from lines 522.

Turning back to FIG. 3, capacitive coupling probes 620a, 620b, 620c are used to perform in-circuit capacitive measurement tests. Whenever necessary or appropriate (e.g., prior to executing an in-circuit test), the tester software 637 generates probe processor instructions for retrieving the probe-specific information (for example, containing calibration parameters specific to the probe) from each of the probes 620a, 620b, 620c. These instructions are sent to the tester hardware 635 and/or controller 636 for formatting and transmission to the respective probes 620a, 620b, 620c. The tester hardware/635 and/or controller 636 transmits the formatted instructions to the appropriate multiplexer cards 646a, 646b on which resides the probe interface circuits (such as shown in FIG. 8) which interface to the respective probes 620a, 620b, 620c. In the illustrative embodiment per FIGS. 7 and 8, the instructions are modulated with the probe signal over the probe signal channel, and responses are received over the probe ground channel, demodulated, and returned to the tester hardware 635 and/or controller 636. The tester hardware 635 and/or controller 636 extracts the retrieved probe-specific information and sends it to the tester software 637.

In the preferred embodiment, the probe-specific information stores either calibration parameters specific to the probe, or identification information from which the calibration parameters of the probe can be looked up in off-probe storage.

When an in-circuit capacitive measurement test is to be executed, the tester software 637 instructs the controller 636 and/or tester hardware 635 to enable and drive a measuring signal over the signal channel of the respective capacitive coupling probe 620a, 620b, 620c over the pin(s) of interest of the integrated circuits 306a, 306b, 306c under test. Simultaneously, tester hardware 635 enables (closes) the relay(s) corresponding to tester interface pins 631 which connect to fixture probes 648 that eventually form an electrical connection with a respective pin of interest and a respective pin(s) to be grounded according to the circuit diagram of FIG. 6. The tester hardware 635 applies a signal (e.g., 310 in FIG. 3) to the respective pin of interest on each device under test 606a, 606b, 606c, and connects the pin(s) to be grounded on each of the devices under test 606a, 606b, 606c to ground. The measuring signal of each probe 620a, 620b, 620c is connected to a respective measuring circuit (e.g., 312 in FIG. 6, to obtain a measurement signal associated with the respective pin of interest. Tester hardware 635 and/or software 637 uses the measurement signal of the respective pin of interest and the calibration parameter(s) associated with the respective measuring probe that obtained the measurement, and calculates the true value of the capacitance on the pin. The tester 530 compares the calculated capacitance of the pin to predetermined threshold limit(s) which define whether the pin is connected to the printed circuit board trace or an open exists between the pin and trace. component under test is present or absent.

Although this preferred embodiment of the present invention has been disclosed for illustrative purposes, those skilled in the art will appreciate that various modifications, additions and substitutions are possible, without departing from the scope and spirit of the invention as disclosed in the accompanying claims. It is also possible that other benefits or uses of the currently disclosed invention will become apparent over time.

What is claimed is:

1. An electrical probe couplable to a measuring device, comprising:
    a probe sensing interface operable to sense at least one signal on at least one node under test;
    a signal channel for transmitting said sensed at least one signal;
    a memory for storing probe-specific information;
    a processor operatively coupled to said memory for retrieving said probe-specific information; and
    a communications interface operable to modulate said probe-specific information with said sensed at least one signal to generate a modulated signal comprising said at least one signal and said probe-specific information, and to transmit said modulated signal to said measuring device over said signal channel.

2. An electrical probe in accordance with claim 1, wherein:
    said probe sensing interface comprises a capacitive plate.

3. An electrical probe in accordance with claim 2, comprising:
    an active amplifier circuit coupled between said capacitive plate and said signal channel.

4. An electrical probe in accordance with claim 1, wherein:
    said probe-specific information comprises at least one calibration parameter associated with said probe.

5. An electrical probe in accordance with claim 4, wherein:
    said probe sensing interface comprises a capacitive plate.

6. An electrical probe in accordance with claim 5, comprising:
    an active amplifier circuit coupled between said capacitive plate and said signal channel.

7. An electrical probe in accordance with claim 1, wherein:
    said probe-specific information comprises probe identification information.

8. An electrical probe in accordance with claim 7, wherein:
    said probe identification information is used for looking up at least one calibration parameter associated with said probe stored off-probe.

9. An electrical probe in accordance with claim 7, wherein:
    said probe sensing interface comprises a capacitive plate.

10. An electrical probe in accordance with claim 9, comprising:
    an active amplifier circuit coupled between said capacitive plate and said signal channel.

11. A capacitive coupling probe, comprising:
    a signal channel comprising a pair of wires over which power is supplied to said probe;
    a capacitive plate coupled to said signal channel;
    a memory for storing probe-specific information;
    a processor operatively coupled to said memory for retrieving said probe-specific information; and
    a communications interface operable to modulate said probe-specific information with said sensed at least one signal to generate a modulated signal comprising said at least one signal and said probe-specific information, and to transmit said modulated signal to said measuring device over said pair of wires of said signal channel.

12. A capacitive coupling probe in accordance with claim 11, comprising:
    an active amplifier circuit coupled between said capacitive plate and said signal channel.

13. A capacitive coupling probe in accordance with claim. 11, wherein:
    said probe-specific information comprises at least one calibration parameter associated with said probe.

14. A capacitive coupling probe in accordance with claim 11, wherein;
    said probe-specific information comprises probe identification information.

15. A capacitive coupling probe in accordance with claim 14, wherein:
    said probe identification information is used for looking up at least one calibration parameter associated with said probe stored off-probe.

* * * * *

UNITED STATES PATENT AND TRADEMARK OFFICE
CERTIFICATE OF CORRECTION

| | | |
|---|---|---|
| PATENT NO. | : 7,109,728 B2 | Page 1 of 1 |
| APPLICATION NO. | : 10/373947 | |
| DATED | : September 19, 2006 | |
| INVENTOR(S) | : Crook et al. | |

It is certified that error appears in the above-identified patent and that said Letters Patent is hereby corrected as shown below:

Column 14, line 47, in Claim 13, delete "claim." and insert -- claim --, therefor.

Column 14, line 52, in Claim 14, after "wherein" delete ";" and insert -- : --, therefor.

Signed and Sealed this

Twentieth Day of March, 2007

JON W. DUDAS
*Director of the United States Patent and Trademark Office*